(12) United States Patent
Apelt et al.

(10) Patent No.: US 10,321,034 B2
(45) Date of Patent: Jun. 11, 2019

(54) IMAGE RECORDING SYSTEM AND A MOTOR VEHICLE

(71) Applicant: Robert Bosch GmbH, Stuttgart (DE)

(72) Inventors: Stefan Apelt, Weissach Im Tal (DE); Stephan Geise, Ruethen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/549,930

(22) PCT Filed: Jan. 15, 2016

(86) PCT No.: PCT/EP2016/050797
§ 371 (c)(1),
(2) Date: Aug. 9, 2017

(87) PCT Pub. No.: WO2016/128173
PCT Pub. Date: Aug. 18, 2016

(65) Prior Publication Data
US 2018/0035025 A1 Feb. 1, 2018

(30) Foreign Application Priority Data

Feb. 10, 2015 (DE) .................. 10 2015 202 314
Jul. 20, 2015 (DE) .................. 10 2015 213 575

(51) Int. Cl.
*H04N 5/225* (2006.01)
*H01L 31/0203* (2014.01)
(Continued)

(52) U.S. Cl.
CPC ....... *H04N 5/2254* (2013.01); *B29C 45/1676* (2013.01); *H01L 31/0203* (2013.01);
(Continued)

(58) Field of Classification Search
CPC combination set(s) only.
See application file for complete search history.

(56) References Cited

U.S. PATENT DOCUMENTS 7,900,521 B2    3/2011  Hooper et al.
2001/0050717 A1 12/2001 Yamada et al.
(Continued)

FOREIGN PATENT DOCUMENTS

DE  102006008230 A1  8/2007
EP  1716018 B1       5/2010
(Continued)

OTHER PUBLICATIONS

International Search Report dated Mar. 24, 2016 of the corresponding International Application PCT/EP2016/050797 filed Jan. 15, 2016.

*Primary Examiner* — Behrooz M Senfi
(74) *Attorney, Agent, or Firm* — Norton Rose Fulbright US LLP; Gerard Messina

(57) ABSTRACT

An image recording system, for example of a motor vehicle, includes a carrier plate, an optics holder with a through hole of which one side is closed by a surface of the carrier plate, and an image recorder situated on the carrier plate surface, a needle channel that extends through the optics holder from the through hole to an outer side of the optics holder and that is suitable for, after the optics holder has been manufactured, injection molding of an encapsulation that forms an optical lens of the image recorder without having to protect a surface of the encapsulation during the manufacturing of the optics holder. Manufacturing of a microstructured protective lens directly after manufacturing of the optics holder on the same injection mold is thus enabled.

19 Claims, 4 Drawing Sheets

(51) Int. Cl.
 *B29C 45/16* (2006.01)
 *H01L 31/0232* (2014.01)
 *B29C 45/00* (2006.01)

(52) U.S. Cl.
 CPC ..... *H01L 31/02327* (2013.01); *H04N 5/2253* (2013.01); *H04N 5/2257* (2013.01); *B29C 45/0013* (2013.01); *B29C 45/1671* (2013.01); *B29C 2045/1678* (2013.01); *H01L 2224/48091* (2013.01)

(56) References Cited

U.S. PATENT DOCUMENTS

| 2003/0158503 | A1* | 8/2003 | Matsumoto | A61B 1/00096 600/593 |
| 2004/0080642 | A1 | 4/2004 | Kobayashi et al. | |
| 2004/0251509 | A1* | 12/2004 | Choi | H01L 27/14618 257/432 |
| 2005/0128334 | A1* | 6/2005 | Do | G02B 9/12 348/335 |

FOREIGN PATENT DOCUMENTS

| EP | 2054270 | B1 | 12/2012 |
| JP | S56103482 | A | 8/1981 |
| JP | S56103483 | A | 8/1981 |
| JP | H0243746 | A | 2/1990 |
| JP | H0513488 | A | 1/1993 |
| JP | H07209588 | A | 8/1995 |
| JP | 2002051268 | A | 2/2002 |
| JP | 2002258129 | A | 9/2002 |
| JP | 2006251543 | A | 9/2006 |
| JP | 2008235486 | A | 10/2008 |
| JP | 2009003130 | A | 1/2009 |
| JP | 5261849 | B2 | 8/2013 |
| WO | 0038249 | A1 | 6/2000 |

* cited by examiner

IMAGE RECORDING SYSTEM AND A MOTOR VEHICLE

CROSS-REFERENCE TO RELATED APPLICATIONS

The present application is the national stage of International Pat. App. No. PCT/EP2016/050797 filed Jan. 15, 2016, and claims priority under 35 U.S.C. § 119 to DE 10 2015 202 314.1, filed in the Federal Republic of Germany on Feb. 10, 2015 and to DE 10 2015 213 575.6, filed in the Federal Republic of Germany on Jul. 20, 2015, the content of each of which are incorporated herein by reference in their entireties.

FIELD OF THE INVENTION

The present invention relates to an image recording system and a motor vehicle.

BACKGROUND

Image recording systems are used in many fields. One example is the use in motor vehicles. Optical camera systems (image recording systems) in motor vehicles detect the vehicle surroundings, for example, and supply items of information for further vehicle systems. Image recording systems are used, for example, for night vision applications, for lane-departure warning, and for monitoring the front or rear area of the vehicle.

Image recording systems include an optics holder, an optics carrier (objective) including multiple lenses, and an image recorder on a carrier plate (imager chip).

The optics holder and the optics carrier are manufactured independently of each other. The objectives used often have specially ground lenses.

During the installation of the camera system, care is to be taken that the optics carrier including optics is optically aligned in relation to the image recorder, because only then is it ensured that the image recorder detects the correct image.

For example, an image recording system, in particular for automotive uses, is known from DE 102006008230 A1, including a substrate, an image sensor, which is fastened on the substrate, an optics unit situated in front of the image sensor, and an optics holder connected to the substrate, in which the optics unit is accommodated.

A camera system having an adjustment option, in which the optics carrier may be aligned in relation to the image recorder, is described in EP 1 716 018 B1. An installation system of a camera system is essentially described in EP 2054270 B1.

SUMMARY

According to an example embodiment of the present invention, an image recording system includes at least one optics holder having a through hole, a carrier plate that includes a surface that closes one side of the through hole, and an image recorder situated on the surface of the carrier plate. A needle channel extends continuously through the optics holder from the through hole to an outer side of the optics holder, the needle channel being suitable for injection molding of an encapsulation of the image recorder acting as an optical lens.

The needle channel enables the encapsulation acting as a lens to be manufactured by injection molding after the optics holder has been manufactured. This in turn enables the encapsulation acting as a lens to be manufactured without having to protect a surface of the encapsulation during the manufacturing of the optics holder. In particular, manufacturing a microstructured protective lens directly after manufacturing the optics holder on the same injection mold is enabled. Thanks to the very good molding properties of the thermosetting material, the encapsulation acting as a lens can be manufactured easily. Overall, features of the present invention have the effect that a camera system, which is cost-effective and robust in relation to environmental influences and which is simple and space-saving in construction, can be manufactured using few process steps and simplified logistics.

The use of transparent thermosetting material for an encapsulation furthermore provides many advantages: the manufacturing, for example, can be implemented entirely on one injection molding machine using only one injection mold. Furthermore, the temperature-dependent change of the refractive index of the thermosetting material can be used to compensate for a thermal focus shift of an objective. In addition, thermosetting material is very resistant to environmental influences such as, for example, ultraviolet light (UV light).

In an example embodiment, the image recording system also includes the dimensionally stable encapsulation, which acts as an optical lens of the image recorder, the encapsulation including at least one transparent thermosetting material, the thermosetting material extending through the needle channel up to the outer side.

In an example, the carrier plate is equipped with a circuit that is also enclosed by the encapsulation. The circuit is then also protected from environmental influences.

The carrier plate can include at least one bond wire circuit.

Thanks to the favorable properties of the thermosetting material during sealing, bond wire circuits can also be sealed without damage to the bond wire circuits being a concern.

The thermosetting material can include silicone, polyurethane, and/or epoxy resin.

The encapsulation can have a surface structure that has an antireflective effect. An antireflective surface structure can be manufactured easily thanks to the very good molding properties of the thermosetting material.

The needle channel can extend in parallel to the surface of the carrier plate.

The optics holder can include a further thermosetting material, which includes a phenol formaldehyde compound, an epoxy resin, and/or a bulk molding compound, which is admixed with 50% to 70% heat-conductive particles. The heat-conductive particles can include boron nitride, aluminum hydroxide, and/or magnesium hydroxide. A fiber component of the further thermosetting material can be formed by 10% to 30% of metal fibers. The metal fibers can include copper, aluminum, and/or silver. The metal fibers may be a fabric.

The carrier plate and image recorder can be heated with the aid of the heat-conductive particles. The metal fibers, in particular but not only in fabric form, provide the optics holder with the required strength. Additionally or alternatively, they offer protection against electromagnetic radiation.

The image recording system may furthermore include lenses that form an objective and that are held at holding positions by the optics holder.

According to an example embodiment, a motor vehicle includes the image recording system described herein.

Exemplary embodiments of the present invention will be explained in greater detail on the basis of the drawings and the following description.

DETAILED DESCRIPTION

Figure 1:
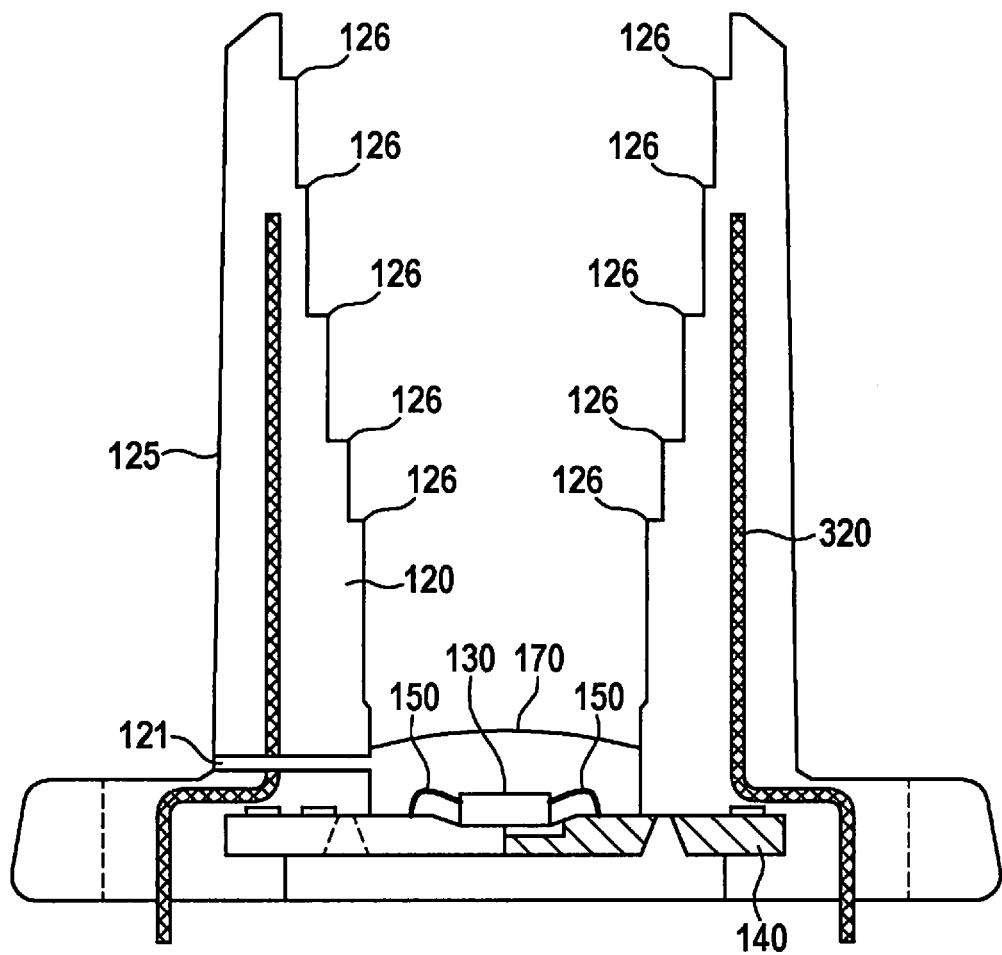
FIG. 1 shows an image recording system according to an example embodiment of the present invention.

FIG. 1 shows an image recording system 100 according to an example embodiment of the present invention. Image recording system 100 includes an optics holder 120 and an image recorder 130, for example, a CCD chip or a CMOS chip (charge coupled device and complementary metal oxide semiconductor, respectively). Optics holder 120 encloses (extrusion coated) a through hole, which is closed at one end by a surface of a carrier plate 140, an image recorder 130 being situated on the surface. A metal fabric 320 is integrated into optics holder 120. A needle channel 121 extends in parallel to the surface through optics holder 120 up to its outer side 125. Needle channel 121 is suitable for injection molding of an encapsulation 170, which acts as an optical lens of the image recorder. Optics holder 120 is stabilized by metal fabric 320 to the extent that a lens arrangement acting as an objective can be held directly by optics holder 120 with the aid of holding positions 126. Holding positions 126 are stepped tapers of the through hole in the direction of carrier plate 140 in the exemplary embodiment. Alternatively, optics holder 120 can have holding positions for an object carrier, which carries the lens arrangement acting as the objective.

Image recorder 130 is connected by bond wires 150 to strip conductors that are filled using potting resin. Image recorder 130 is sealed on a surface of carrier plate 140 using dimensionally-stable encapsulation 170. Encapsulation 170 includes at least one transparent thermosetting material. The thermosetting material extends through needle channel 121 in optics holder 120 up to its outer side 125. Encapsulation 170 acts as an optical lens.

The image recording system can include centering elements, which ensure that optical axes of the lenses and the image recorder are located in the image plane and are coincident.

The lens arrangement can be situated in the position along the shared optical axis of lenses and image recorder at which the image recorder is situated in the focus of the optics.

Figure 2:
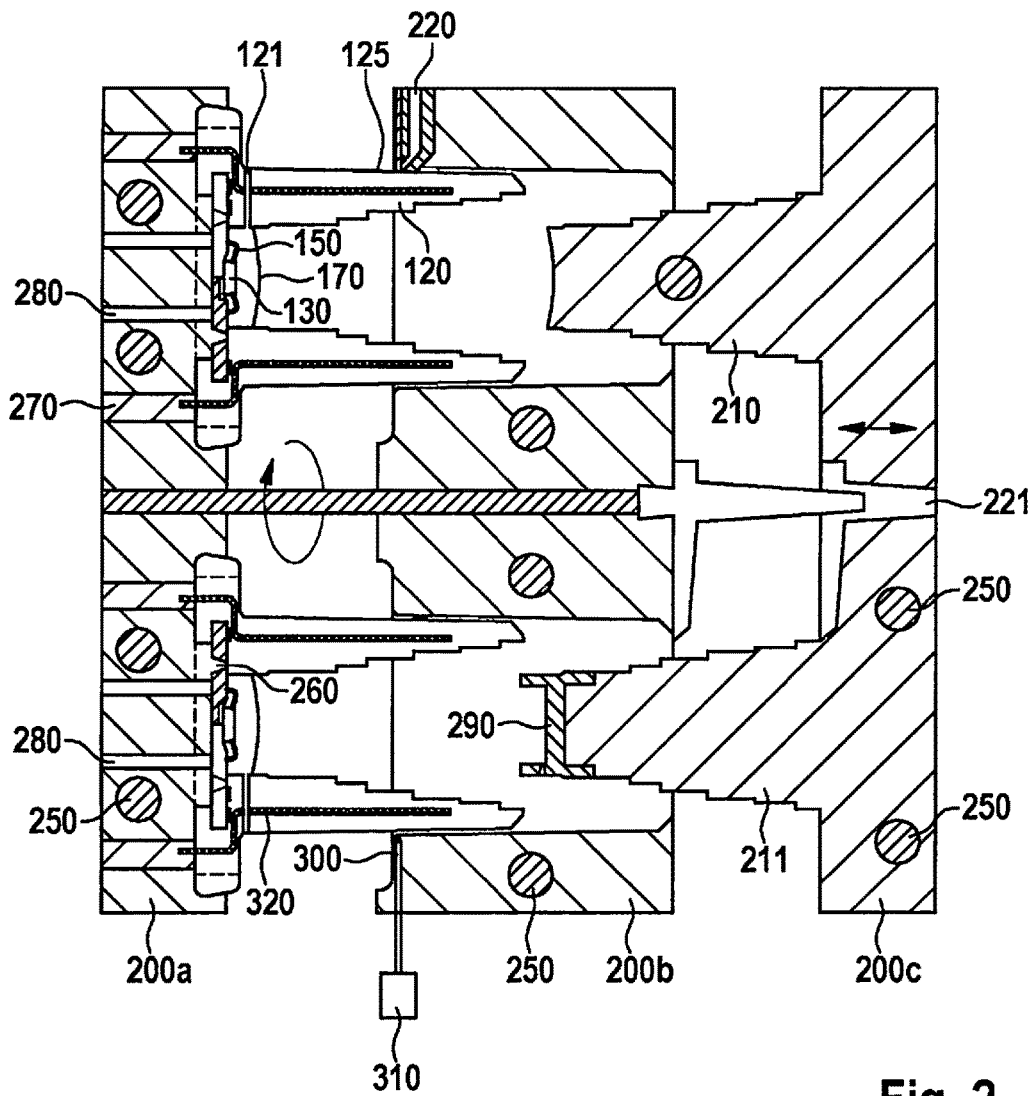
FIG. 2 shows an injection mold according to an example embodiment of the present invention.

FIG. 2 shows a specific embodiment of injection mold 200 according to the present invention in the open state in section. The optical axis of image recorder 130 is in the image plane. Injection mold 200 includes three parts 200a, 200b, 200c. Upon assembly of parts 200a, 200b, 200c, two cavities form with the aid of punches 210, 211, which can each be filled using a thermosetting material via an associated runner 220, 221. To improve the injection molding, heating cartridges 250 are situated in injection mold 200. One of the cavities, which is formed by punch 211, is a negative mold of optics holder 120. The other of the cavities, which is formed by punch 210, is a negative mold of an encapsulating lens 170 for encapsulating image recorder 130, which is situated on a carrier plate 140. Punch 210 can have a microstructured surface.

Part 200a is rotatable in relation to parts 200b, 200c, so that an image recorder 130 situated on carrier plate 140 can be enclosed in one cavity using an optics holder 120, and then can be turned over by rotation into the other cavity and encapsulated using a lens 170.

For this purpose, receptacle pins 260 in part 200a are inserted into receptacles in carrier plate 140. The one cavity is then closed using carrier plate 140 and the carrier plate is enclosed using an optics holder 120. A metal fabric 320 is optionally integrated into optics holder 120. A needle 300, which is insertable by a core puller 310 into the cavity before the extrusion coating, has the effect that a needle channel 121 remains in optics holder 120.

Carrier plate 140 including enclosed image recorder 130 is turned over by rotation of part 200a so that the other cavity may thereafter be closed. The cavity is then filled using the encapsulation, for example, in the form of an optical lens, through needle channel 121, which is accessible from outer side 125 of optics holder 120, in optics holder 120.

Part 200a can be detached from parts 200b, 200c and carrier plate 140 by compressed air with the aid of air channels 280. An ejector 270 thereafter enables the ejection of the image recording system from carrier plate 140 together with enclosed image recorder 130 and optics holder 120.

It is also possible that the carrier plate is retained with the aid of vacuum on part 200a, when part 200a is detached from parts 200b, 200c with the aid of ejector 270.

Figure 3:
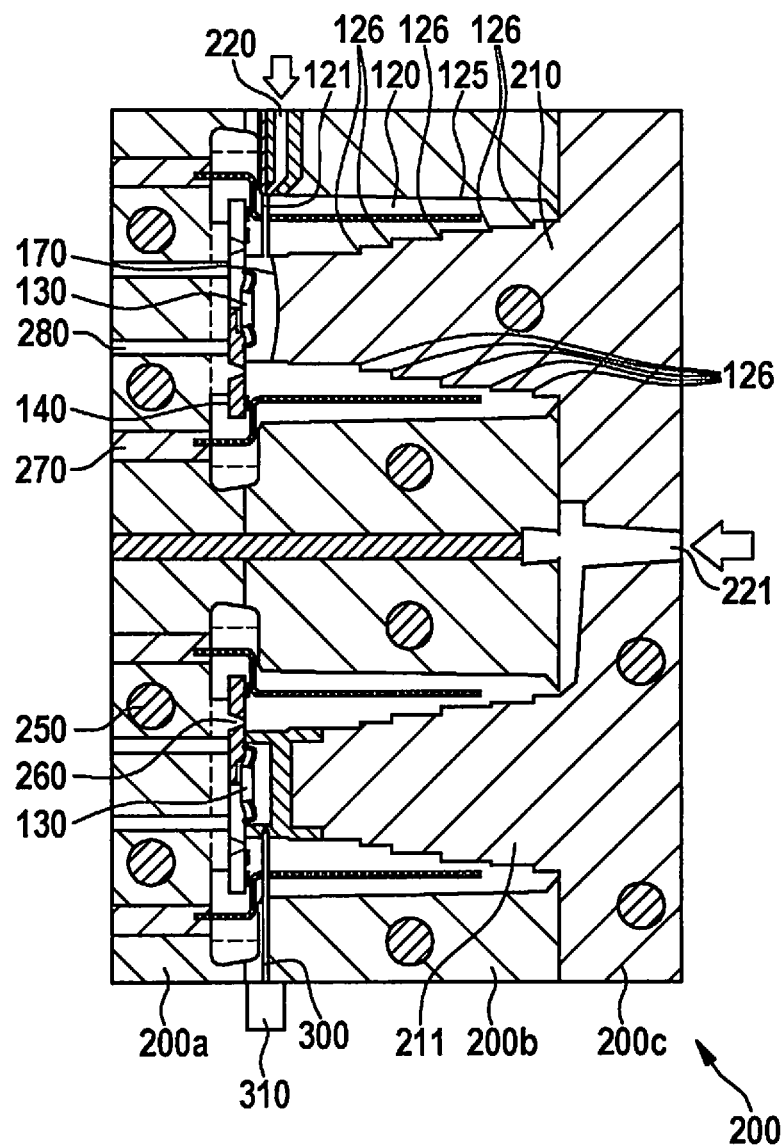
FIG. 3 shows the injection mold of FIG. 2 in a closed state, according to an example embodiment of the present invention.
Figure 4:
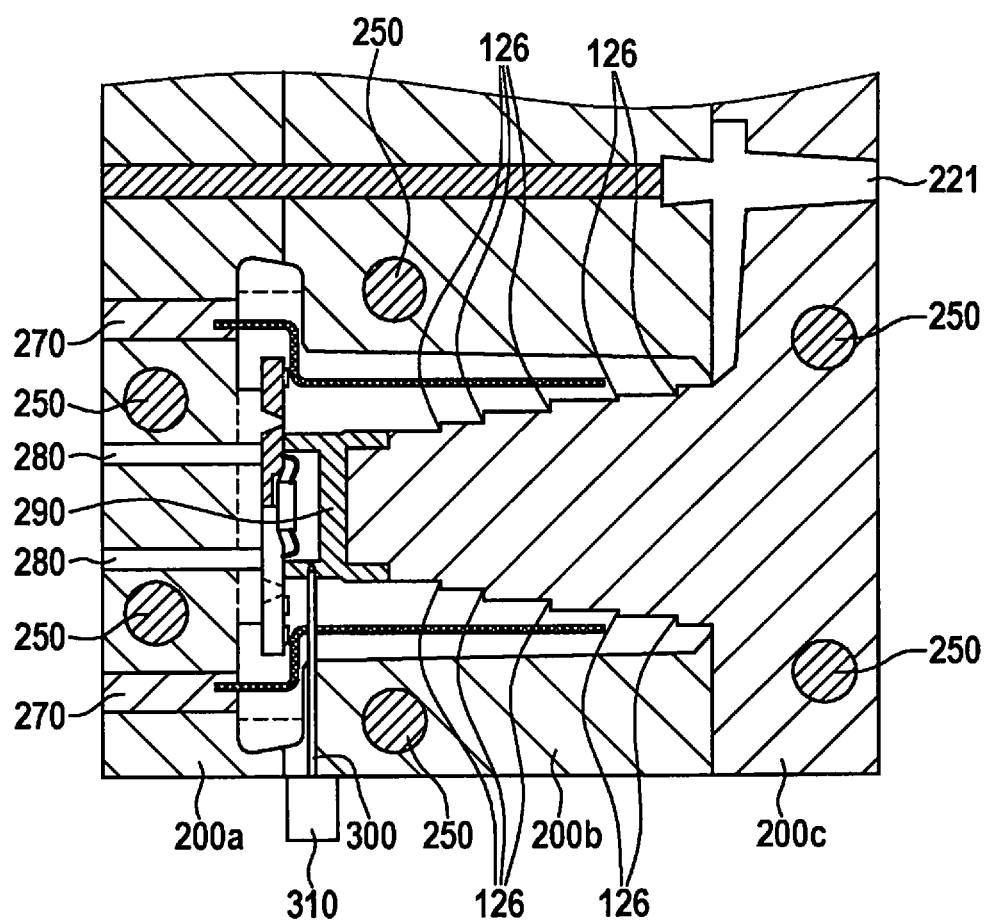
FIG. 4 shows a detail of the injection mold of FIG. 3 in the closed state, according to an example embodiment of the present invention.

FIG. 3 shows the injection mold from FIG. 2 in the closed state. The one cavity is formed by carrier plate 140 including image recorder and punch 211, at the end of which a sealing body 290 is situated, made of, for example, perfluoroalkoxy polymer (PFA—injection-moldable Teflon). Needle 300 is situated in the cavity by core puller 310 in such a way that it extends up into a depression in sealing body 290. The injection mold can be heated via heating cartridges 250, so that sealing body 290 expands and seals off the image recorder and the bond wires. The one cavity can be filled through runner 221, so that an object holder 120 results, the image recorder and the bond wires being protected by sealing body 290. During the injection molding of object holder 120, needle 300 has the effect that a needle channel 121, which extends continuously up to sealing element 290, remains open in object holder 120.

After turning over into the other cavity, encapsulation 170 in the form of an optical lens can be injection molded through needle channel 121.

Carrier plate 140 including enclosed image recorder 130 is retained on part 200a with the aid of vacuum in air channels 280, when part 200a is detached from part 200b with the aid of ejector 270.

An example embodiment of the present invention is directed to a method for manufacturing an image detection system (camera system), for example, for a surroundings detection system of a vehicle. The image detection system includes an optics holder and an optics carrier, the optics of which are used for guiding incident light onto an image recorder and also the media-tight implementation of the associated electronics including imager chip. Using the method, a cost-effective camera system, which is robust in relation to environmental influences, can be manufactured. Due to targeted function integration and function-appropriate material use, fewer process steps and individual parts are required. In addition, the construction is simple and space-saving, and the cost and time expenditure for manufacturing and logistics is reduced.

This exemplary embodiment enables the manufacturing of novel camera modules, for example, for surroundings detection systems, having a dimensionally-stable housing made of thermosetting plastics and a transparent lens, which is formed by a 2-component encapsulation, of the camera image recorder. The manufacturing can be carried out completely on only one injection molding machine and in only one injection mold. Because of the low viscosity of the transparent component, only low pressures arise during the injection procedure, so that circuits having bond wire circuits can also be used, or the separate potting process of the bond wire circuits can be omitted, respectively. At the same time, a protective layer is formed, which seals the circuit and the chip and prevents pixel errors by keeping out particles.

Furthermore, the temperature-dependent change of the refractive index of the special transparent potting compound can be intentionally used to compensate for the thermal focus shift of the objective.

Since the transparent thermosetting material molds very well and cross-links thereafter, additional optical functions, for example, antireflection coatings by special microstructures, can be integrated into this transparent lens.

In certain cases, the lowermost lens in the optics carrier may be omitted due to the design of this layer.

Since the material is very resistant, environmental influences, for example, UV light, do not leave traces in or on the layer in the long term.

In a first step of this specific embodiment, a circuit board (carrier plate), which is equipped with the imager chip and the circuit, is placed via the handling system into the open injection mold and fixed using receptacle pins and a vacuum.

After the closing of the mold, a needle is situated in the cavity by using a core puller. The imager chip and parts of the cavity enclosing the strip conductors are sealed off in relation to the cavity by way of the closing of the mold by a sealing body made of, for example, perfluoroalkoxy polymer (PFA—injection-moldable Teflon). The sealing body expands in the event of a temperature increase, becomes soft, and adapts itself optimally to the surface of the opposite side, so that no low-viscosity material may penetrate. It is recommendable that the sealing body be replaced after approximately 500 cycles. A metal fabric can subsequently be situated in the cavity and the cavity can be filled using a heat-conductive thermosetting plastic such as, for example, phenol, epoxy resin, or bulk molding compounds (BMC), possibly using corresponding fillers, for example, 50% to 70% heat-conductive solid particles. The optics holder is molded having the holding positions for the lens arrangement, the needle keeping a needle channel clear.

No additional adhesive bonding process steps are required for the permanent connection between the holder and the circuit carrier.

After a predefined cross-linking time, the core puller retracts the needle. The pre-molded blank is then ejected and turned over by a rotational movement of the ejector-side mold part via the turntable into a second cavity. The drawn-in circuit carrier including optics holder is demolded by compressed air. Alternatively, this step can also be carried out via the handling system, which also, for example, removes the finished image recording system made of optics holder and enclosed image recorder at the end of the cycle.

Due to the rotational movement, the needle channel is situated in the reclosed injection mold in front of a cold channel of an LSR injection unit, through which, together with the needle channel, imager chip and parts of the strip conductors are extrusion coated using transparent plastic. The transparent component can be, for example, a liquid silicone or a transparent potting compound based on polyurethane or epoxy. The material can be, for example, a siloprene LSR 7090 from Momentive. In order that the low-viscosity compound does not run into the injection mold and so that it presses against the circuit board optimally, a sealing frame made of, for example, perfluoroalkoxy polymer (PFA—injection-moldable Teflon) can be fixed on the ejector side.

The punch, which also forms the lens cavity, can be designed optionally as concave, convex, or plane-parallel by replaceable inserts. The mold insert can have a microstructure, which is optimally molded by the low-viscosity plastic, to make the lens surface antireflective. The injection mold can advantageously be heated to 120° C. to 160° C., for example, using electrical heating cartridges, so that the transparent component cross-links. To obtain better adhesion of the lens on the circuit carrier, individual grooves for a form fit may be introduced onto the circuit board rear side.

A lens arrangement can subsequently be glued in place directly or with the aid of an optics carrier.

In addition to the use of cost-effective materials, due to the function integration of molding and optical properties, work and facility costs and also manufacturing costs and logistics time can be saved.

For the encapsulation according to this specific embodiment, a 2-component injection mold and a 2-component injection molding machine are required. The injection molding machine is to be equipped with a thermosetting assembly and an elastomer assembly as well as a turntable and a handling system.

A heat-conductive thermosetting material can be used for heating the imager chip. It can be both a phenol formaldehyde compound (PF) and an epoxy resin (EP) or a bulk molding compound (BMC), which is filled using 50% to 70% heat-conductive solid particles such as, for example, boron nitride, aluminum hydroxide, or magnesium hydroxide or a combination thereof, instead of using the standard filler. In addition, 10% to 30% of the standard glass fibers can be substituted by heat-conducting metal fibers made of, for example, copper, aluminum, silver or a combination thereof corresponding to the required strength of the housing. The metal fibers can form a fabric.

These metal fibers can additionally ensure EMC (electromagnetic compatibility) protection.

Due to the identical cross-linking temperatures, both components can be manufactured in parallel in the injection mold having two cavities.

After a predefined cross-linking time, the entire optics holder can be removed from the mold using the handling system and equipped with the optics carrier in a separate assembly line by an adhesive bond.

What is claimed is:
1. An image recording system, comprising:
   at least one optics holder with a through hole and with a needle channel that extends through the optics holder from the through hole to an outer side of the optics holder;
   a carrier plate, a surface of which closes one side of the through hole; and
   an image recorder situated on the surface of the carrier plate;
   wherein the needle channel is configured to injection mold an encapsulation that acts as an optical lens of the image recorder, and wherein the optics holder encloses, by an extrusion coating, the through hole, which is closed at one end by the surface of the carrier plate.

2. The image recording system of claim 1, wherein the encapsulation includes at least one transparent thermosetting material that extends through the needle channel up to the outer side.

3. The image recording system of claim 2, wherein the carrier plate includes a circuit that is also enclosed by the encapsulation.

4. The image recording system of claim 2, wherein the thermosetting material includes at least one of silicone, polyurethane, and epoxy resin.

5. The image recording system of claim 2, wherein a surface structure of the encapsulation has an antireflective effect.

6. The image recording system of claim 1, wherein the carrier plate includes at least one bond wire circuit.

7. The image recording system of claim 1, wherein a direction in which the needle channel extends is parallel to the surface of the carrier plate.

8. The image recording system of claim 1, wherein the optics holder includes a thermosetting material that includes at least one of a phenol formaldehyde compound, an epoxy resin, and a bulk molding compound, admixed with up to 50% to 70% heat-conductive particles.

9. The image recording system of claim 8, wherein the heat-conductive particles include at least one of boron nitride, aluminum hydroxide, and magnesium hydroxide.

10. The image recording system of claim 1, wherein the optics holder includes a thermosetting material 10% to 30% of a fiber portion of which is formed by a metal fabric.

11. The image recording system of claim 10, wherein the metal fabric includes at least one of copper, aluminum, and silver.

12. The image recording system of claim 1, further comprising:
lenses that form an objective and that are held by the optics holder at holding positions.

13. A motor vehicle, comprising:
an image recording system, including:
at least one optics holder with a through hole and with a needle channel that extends through the optics holder from the through hole to an outer side of the optics holder;
a carrier plate, a surface of which closes one side of the through hole; and
an image recorder situated on the surface of the carrier plate;
wherein the needle channel is configured to injection mold an encapsulation that acts as an optical lens of the image recorder, and
wherein the optics holder encloses, by an extrusion coating, the through hole, which is closed at one end by the surface of the carrier plate.

14. The motor vehicle of claim 13, wherein the optics holder is stabilized to the extent that a lens arrangement is hold-able directly by one of: (i) the optics holder with the aid of holding positions, which are stepped tapers of the through hole in the direction of the carrier plate; and (ii) the optics holder has holding positions for an object carrier, which carries the lens arrangement.

15. The motor vehicle of claim 13, wherein (i) is satisfied.

16. The motor vehicle of claim 13, wherein (ii) is satisfied.

17. The image recording system of claim 1, wherein the optics holder is stabilized to the extent that a lens arrangement is hold-able directly by one of: (i) the optics holder with the aid of holding positions, which are stepped tapers of the through hole in the direction of the carrier plate; and (ii) the optics holder has holding positions for an object carrier, which carries the lens arrangement.

18. The image recording system of claim 1, wherein (i) is satisfied.

19. The image recording system of claim 1, wherein (ii) is satisfied.

* * * * *